(12) United States Patent
Shih

(10) Patent No.: US 9,055,529 B2
(45) Date of Patent: Jun. 9, 2015

(54) SYSTEM AND METHOD FOR ADAPTIVE IN-NETWORK TIME ALIGNMENT FOR ENVELOPE TRACKING POWER AMPLIFIER

(71) Applicant: Samsung Electronics Co., LTD, Suwon-si, Gyeonggi-do (KR)

(72) Inventor: Huei Yuan Shih, Murphy, TX (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 69 days.

(21) Appl. No.: 14/046,742

(22) Filed: Oct. 4, 2013

(65) Prior Publication Data
US 2015/0099564 A1   Apr. 9, 2015

(51) Int. Cl.
*H04M 1/00* (2006.01)
*H04B 1/38* (2006.01)
*H04W 52/02* (2009.01)
*H04B 1/04* (2006.01)

(52) U.S. Cl.
CPC ... *H04W 52/0209* (2013.01); *H04B 2001/0408* (2013.01); *H04B 2001/045* (2013.01)

(58) Field of Classification Search
CPC ............ H04W 52/02; H04W 52/0229; H04W 52/0225; H03F 3/24; H03F 2200/451; H03F 1/3247
USPC ......... 455/77, 78, 114.1–114.3, 127.1, 127.2, 455/127.5, 550.1, 552.1, 572, 574; 375/297
See application file for complete search history.

(56) References Cited

U.S. PATENT DOCUMENTS

| | | | | |
|---|---|---|---|---|
| 8,718,579 B2* | 5/2014 | Drogi | .............................. | 455/126 |
| 8,873,677 B1* | 10/2014 | Loh et al. | ........................ | 375/297 |
| 8,908,797 B2* | 12/2014 | Jeckeln | .......................... | 375/297 |
| 2013/0034139 A1* | 2/2013 | Khlat et al. | ................... | 375/224 |

* cited by examiner

*Primary Examiner* — Nhan Le

(57) ABSTRACT

A subscriber station is configured to extend a battery life using a method for envelope tracking power amplification. The subscriber station includes a main processor configured to perform a plurality of functions to operate the subscriber station. The subscriber station also includes a power source configured to provide power to one or more components in the subscriber station and an envelope tracking power amplifier (ET PA) configured to amplify a signal. The ETPA also is configured to estimate and adaptively maintain the envelope and RF signal time alignment during operation of the ET PA.

20 Claims, 8 Drawing Sheets

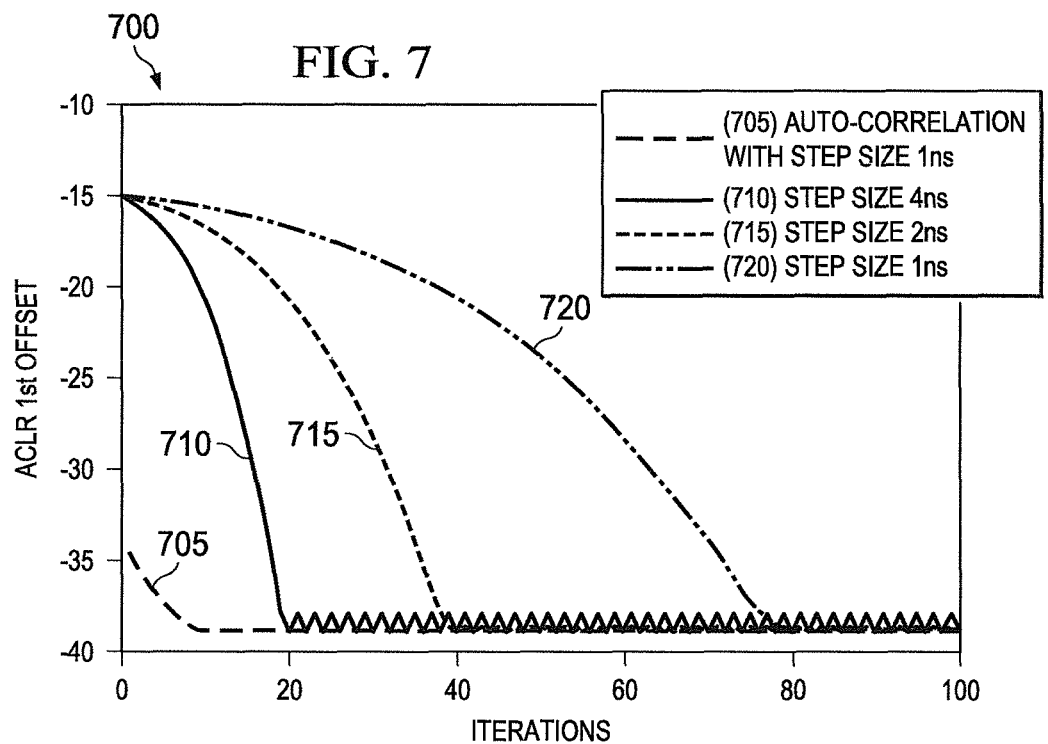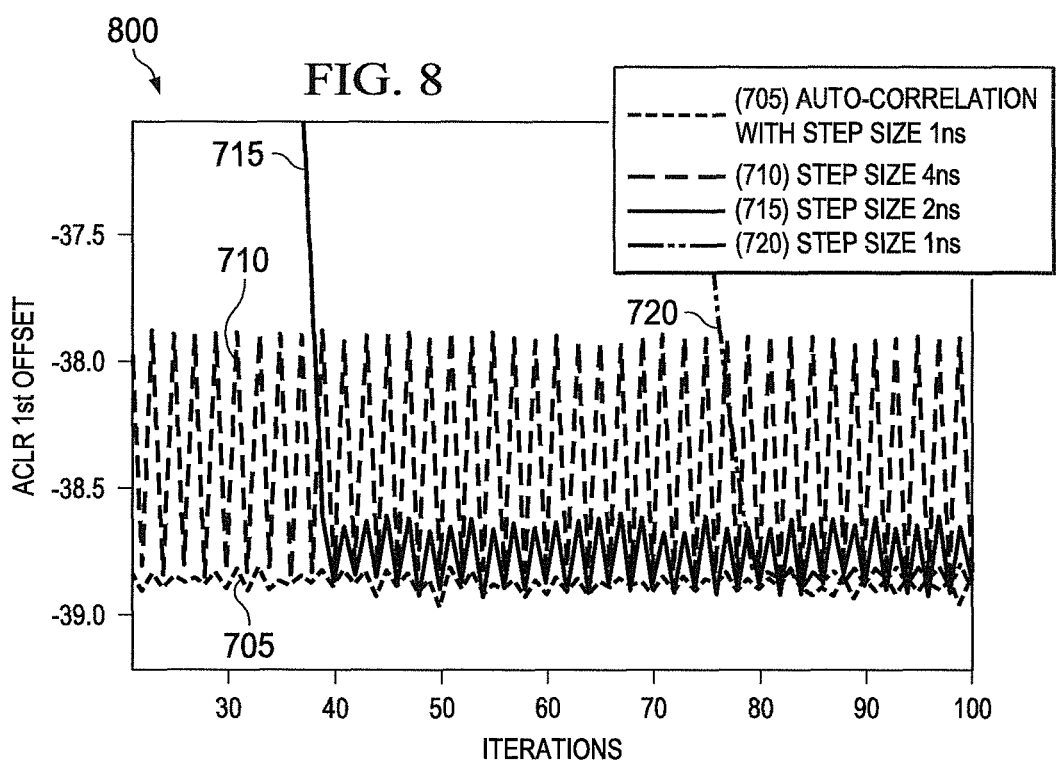

SYSTEM AND METHOD FOR ADAPTIVE IN-NETWORK TIME ALIGNMENT FOR ENVELOPE TRACKING POWER AMPLIFIER

TECHNICAL FIELD

The present application relates generally to power management in mobile devices and, more specifically, to Adaptive Time Alignment process for Envelope Tracking RF Power Amplifier in mobile devices.

BACKGROUND

The wireless communication industry is experiencing tremendous growth in the mobile internet device with 4G LTE wireless network deployed. It allows data center to provide cloud computing service through the smartphone and tablet PC to make their business more efficient. Therefore extending battery life of the mobile internet device becomes very critical and puts pressure on the transmitter designer to focus on more sophisticated high efficiency RF power amplifier, e.g. Envelope Tracking (ET).

SUMMARY

A subscriber station is provided. The subscriber station includes a main processor configured to perform a plurality of functions to operate the subscriber station. The subscriber station also includes a power source configured to provide power to one or more components in the subscriber station and an envelope tracking power amplifier (ET PA) configured to amplify a signal. The ETPA also is configured to estimate and adaptively maintain the envelope and RF signal time alignment during operation of the ET PA.

An Envelope Tracking Power Amplifier (ET PA) is provided. The ET PA includes an envelope path, an RF path, a signal processing unit configured to receive a signal, a plurality of delays coupled to the signal processing unit and configured to delay a signal transmitted via one of the envelope path and the RF path, and a power amplifier (ET PA) configured to amplify a signal. The ET PA also includes a digital signal processor—central processing unit (DSP-CPU) coupled to an output of the power amplifier and to the plurality of delays. The DSP-CPU configured to estimate and adaptively maintain the envelope and RF signal time alignment during operation of the ET PA.

A method for envelope tracking power amplification is provided. The method includes estimating and adaptively maintaining an envelope and RF signal time alignment during the operation of an envelope tracking power amplifier.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 7 and 8 illustrate an example time alignment process converging speed performance with fixed correction according to embodiments of the present disclosure.

DETAILED DESCRIPTION

Figure 1:
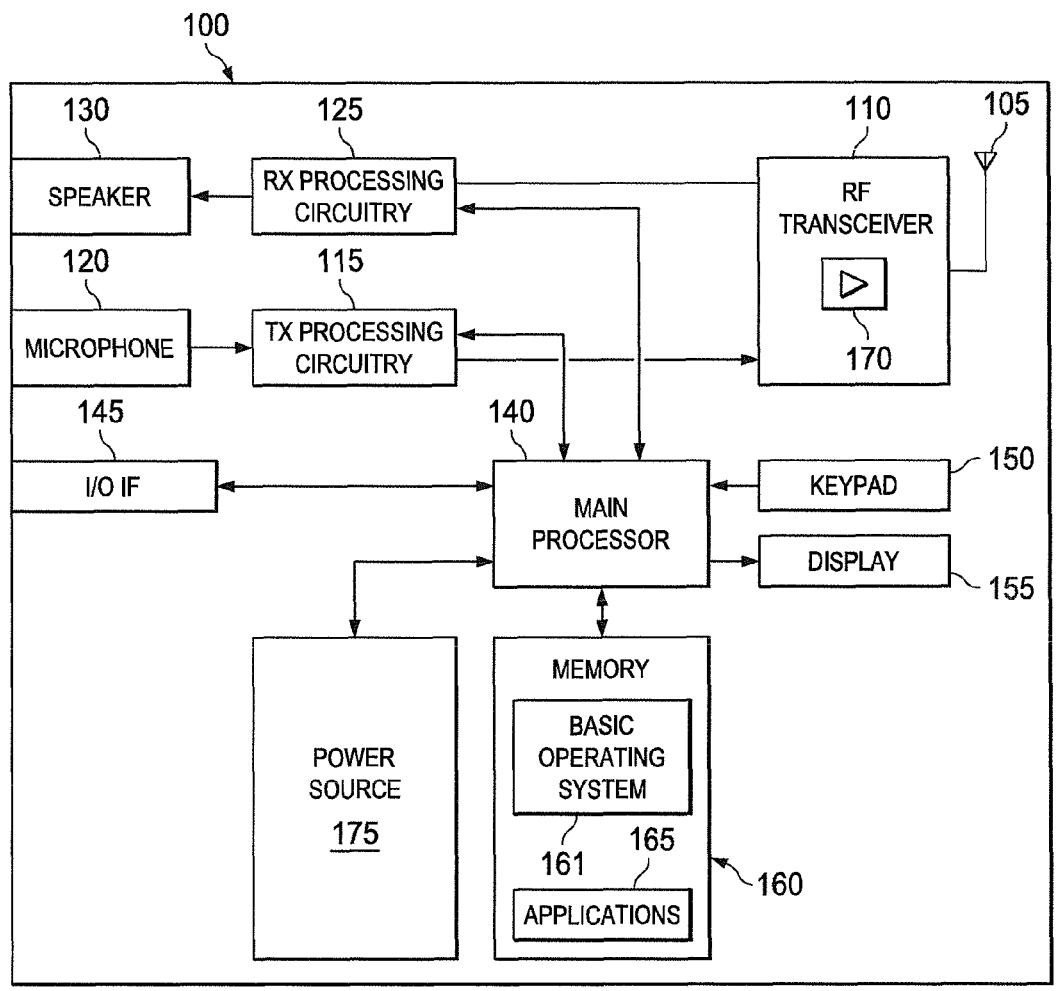
FIG. 1 illustrates a subscriber station according to embodiments of the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications device.

In mobile communication system, a mobile phone includes an amplifier that essentially amplifies an input signal. A portion of the mobile phone's battery power is consumed by the amplifier. An Adaptive Time Alignment process is critical to the Envelope Tracking Power Amplifier (ET PA) to meet 3GPP mask requirements. Certain cross-correlation/auto-correlation processes are proposed to estimate the time mismatch. But these approaches are limited to estimate a short range time mismatch and require high computation time to achieve optimal ET performance.

The tolerance of the time alignment has narrow range in the linearity performance when an Envelope Tracking Power Amplifier (ET PA) operates at very high efficiency condition. In this case the Adjacent Channel Power Ratio (ACPR) performance can easily degrade a couple of dB and fail comply the mask requirement with small time mismatch in the range of from 500 ps to 1 ns. Cross-correlation/auto-correlation processes have limitation to estimate such a short range time mismatch since these processes estimate the time mismatch based on the distance between the highest and second peaks location. When the time misalignment is small, the highest peak and the second peak can merge together and the time mismatch cannot be identified. Furthermore the time mismatch often occurred with a small amount of time delay when the temperature and output power changed. Hence a cost effective solution, adaptive in-network time alignment process, can adaptively fine tuning time alignment between the envelope and RF path to optimize the ET PA linearity performance is required.

The Envelope Tracking (ET) system can provide a better power efficiency performance. However, its linearity performances, ACPR and Error Vector Magnitude (EVM), are sensitive to the delay mismatch between envelope and RF path to the PA. The auto-correlation time alignment process can be employed to estimate the time mismatch in the ET system. But it cannot compensate a short time mismatch. Moreover the estimate errors are introduced with the limited signal length, operating output power and shaping functions. Increasing the computation resource (Digital Signal Processor-Central Processing Unit (DSP-CPU) or Field Programmable Gate Array (FPGA) silicon area) to improve the accuracy of the process is impractical. To minimize the time mismatch estimate error and extend the time alignment range the adaptive in-network time alignment process is developed as a complementary function to the auto-correlation time alignment process. This approach can be used to maintain the time alignment adaptively during ET PA operation without disturbing the communication.

FIG. 1 illustrates a subscriber station according to embodiments of the present disclosure. The embodiment of the subscribe station 100 illustrated in FIG. 1 is for illustration only. Other embodiments of the wireless subscriber station could be used without departing from the scope of this disclosure.

UE 100 comprises antenna 105, radio frequency (RF) transceiver 110, transmit (TX) processing circuitry 115, microphone 120, and receive (RX) processing circuitry 125. Although shown as a single antenna, antenna 105 can include multiple antennas. SS 100 also comprises speaker 130, main processor 140, input/output (I/O) interface (IF) 145, keypad 150, display 155, and memory 160. Memory 160 further comprises basic operating system (OS) program 161 and a plurality of applications 162. The plurality of applications can include one or more of resource mapping tables (Tables 1-10 described in further detail herein below). SS 100 further includes a power source 175 coupled to the main processor 140. In certain embodiments, power source 175 is a battery. Power source 175 is configured to provide power to the components of SS 100. For example, power source 175 is configured to provide power for one or more of main processor 140, antenna 105, RF transceiver 110, RX processing circuitry 125, TX processing circuitry 115, speaker 130, microphone 120, I/O interface (IF) 145, keypad 150, display 155, and memory 160. In certain embodiments, power source 175 represents multiple components configured to provide power to SS 100. For example, power source 175 can be multiple batteries configured to provide power to different components within SS 100.

Radio frequency (RF) transceiver 110 receives from antenna 105 an incoming RF signal transmitted by a base station of wireless network. Radio frequency (RF) transceiver 110 down-converts the incoming RF signal to produce an intermediate frequency (IF) or a baseband signal. The IF or baseband signal is sent to receiver (RX) processing circuitry 125 that produces a processed baseband signal by filtering, decoding, and/or digitizing the baseband or IF signal. Receiver (RX) processing circuitry 125 transmits the processed baseband signal to speaker 130 (i.e., voice data) or to main processor 140 for further processing (e.g., web browsing).

Transmitter (TX) processing circuitry 115 receives analog or digital voice data from microphone 120 or other outgoing baseband data (e.g., web data, e-mail, interactive video game data) from main processor 140. Transmitter (TX) processing circuitry 115 encodes, multiplexes, and/or digitizes the outgoing baseband data to produce a processed baseband or IF signal. Radio frequency (RF) transceiver 110 receives the outgoing processed baseband or IF signal from transmitter (TX) processing circuitry 115. Radio frequency (RF) transceiver 310 up-converts the baseband or IF signal to a radio frequency (RF) signal that is transmitted via antenna 105.

In certain embodiments, main processor 140 is a microprocessor or microcontroller. Memory 160 is coupled to main processor 140. According to some embodiments of the present disclosure, part of memory 160 comprises a random access memory (RAM) and another part of memory 160 comprises a Flash memory, which acts as a read-only memory (ROM).

Main processor 140 executes basic operating system (OS) program 161 stored in memory 160 in order to control the overall operation of wireless subscriber station 100. In one such operation, main processor 140 controls the reception of forward channel signals and the transmission of reverse channel signals by radio frequency (RF) transceiver 110, receiver (RX) processing circuitry 125, and transmitter (TX) processing circuitry 115, in accordance with well-known principles.

Main processor 140 is capable of executing other processes and programs resident in memory 160, such as operations for performing adaptive time alignment for envelope tracking power amplification as described in embodiments of the present disclosure. Main processor 140 can move data into or out of memory 160, as required by an executing process. In some embodiments, the main processor 140 is configured to execute a plurality of applications 162, such as applications for Coordinated Multipoint (CoMP) communications and Multi-User-Multiple Input Multiple Output (MU-MIMO) communications. The main processor 140 can operate the plurality of applications 162 based on OS program 161 or in response to a signal received from a base station (BS). Main processor 140 is also coupled to I/O interface 145. I/O interface 145 provides subscriber station 100 with the ability to connect to other devices such as laptop computers and handheld computers. I/O interface 145 is the communication path between these accessories and main controller 140.

Main processor 140 is also coupled to keypad 150 and display unit 155. The operator of subscriber station 100 uses keypad 150 to enter data into subscriber station 100. Display 155 may be a liquid crystal display capable of rendering text and/or at least limited graphics from web sites. Alternate embodiments may use other types of displays.

The subscriber station 100 also includes an envelope tracking power amplifier (ET PA) 170. The ET PA 170 is configured to amplify a signal that is received by the RX processing circuitry 125 or a signal that is generated by another component within SS 100. The amplified signal can be output via speaker 130, such as under control of the main processor 140, an application 162, RF transceiver 110, ET PA 170, RX processing circuitry 125 or TX processing circuitry 115. The amplified signal also can be transmitted to the main processor 140 for further processing.

In certain embodiments, the envelope tracking power amplifier 170 is disposed within transceiver 110. However, in other embodiments, the envelope tracking power amplifier 170 is located in another portion of the subscriber station 100. For example, the envelope tracking power amplifier 170 can be disposed within the main processor 140, RX processing circuitry 125, TX processing circuitry 115, or as a stand-alone circuitry coupled to one or more of the main processor 140, RX processing circuitry 125, TX processing circuitry 115, the RF transceiver 110 and antenna 105. In certain embodiments, the envelope tracking power amplifier 170 functions are included in a combination of the main processor 140, RX processing circuitry 125, TX processing circuitry 115, the RF transceiver 110 and antenna 105.

Embodiments of the present disclosure provide a robust envelope tracking (ET) time alignment method including an auto-correlation process and an adaptive time alignment process with a variable correction to update the time delay per iteration. Embodiments of the present disclosure take the advantage of the auto-correlation time alignment process to estimate long distance time mismatch in conjunction with the iterative process to compensate the short distance time mismatch, to minimize the time mismatch estimate error and maintain the ET system envelope/RF signal aligned during operation.

Figure 2:
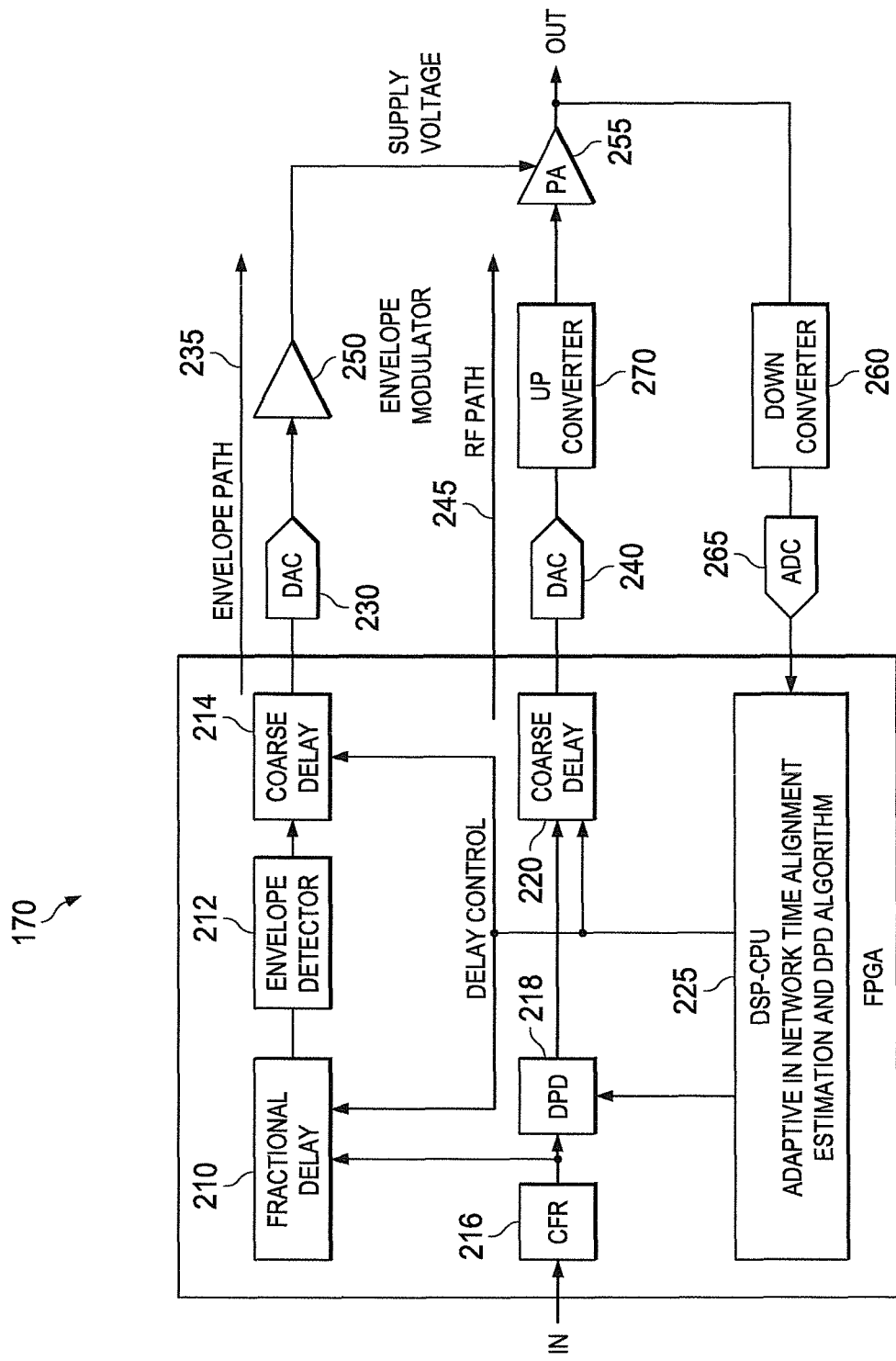
FIG. 2 illustrates an envelope tracking power amplifier according to embodiments of the present disclosure.

FIG. 2 illustrates an envelope tracking power amplifier according to embodiments of the present disclosure. The embodiment of the ET PA 170 shown in FIG. 2 is for illustration only. Other embodiments could be used without departing from the scope of the present disclosure.

In the example shown in FIG. 2, the ET PA 170 is a general block diagram of high efficient ET system. The ET PA 170 includes a digital signal processing block 205 (e.g., a FPGA). The digital signal processing block 205 includes circuitry for Fractional Delay 210, Envelope Detector 214, envelope path Coarse Delay 216, Crest Factor Reduction (CFR) 216, Digital Pre-Distortion (DPD) 218, and RF Coarse Delay 220. The FPGA 205 also includes a DSP-CPU 225. The DSP-CPU 225 is responsible for the time alignment process and power amplifier modeling for the digital pre-distortion function. The time alignment units processed by the DSP-CPU 225 contain: Fractional delay in the envelope path 235; and Coarse delay in the envelope and RF path 245. The ET PA 170 also includes a Digital to Analog Converter (DAC) 230 for the envelope path 235 and a DAC 240 for the RF path 245. The ET PA 170 further includes a modulator 250 coupled to a power amplifier 255 and a down converter 260 coupled between the power amplifier 255 and an analog to digital converter 265, which is further coupled to the DSP CPU 225.

The modulator 250 in the envelope path 235 delivers modulation power through the bias of the power amplifier (PA) 255, which can be a Class AB power amplifier. During the amplification process, a complex signal is sent through the RF path 245 while its envelope waveform is sent simultaneously through the envelope path 235 to drive the PA 255 bias. The digital signal processing block 205 (e.g., FPGA) includes DSP-CPU 225 to perform the adaptive in-network time alignment and digital pre-distortion processes and three delay blocks (Fractional Delay 210, envelope path Coarse Delay 216, and RF Coarse Delay 220) to compensate the time mismatch between the envelope path 235 and the RF path 240. The digital signal processing block 205 contains the crest factor reduction and up-sampling process.

The ET PA 170 can provide a better power efficiency performance. However, its linearity performances, Adjacent Channel Leakage Ratio (ACPR) and EVM, are sensitive to the delay mismatch between envelope path 235 and RF path 245 to the PA 255. The auto-correlation time alignment process can be employed to estimate the time mismatch in the ET PA 170. However, the auto-correlation time alignment process cannot compensate a short time mismatch. Moreover the estimate errors are introduced with the limited signal length, operating output power and shaping functions. Increasing the computation resource (DSP-CPU or FPGA silicon area) to improve the accuracy of the process is impractical. To minimize the time mismatch estimate error and extend the time alignment range, the adaptive in-network time alignment process is developed as a complementary function to the auto-correlation time alignment process. This approach can be used to maintain the time alignment adaptively during ET PA 170 operation without disturbing the communication.

The ET PA 170 is configured to perform an adaptive time-alignment algorithm. The time alignment criterion is based on the mask performances (Evolved Universal Terrestrial Radio Access (EUTRA), UMTS Terrestrial Radio Access-1 (UTRA1), UMTS Terrestrial Radio Access-2 (UTRA2), and EVM). The ET PA 170 adaptive time-alignment process includes non-iterative and iterative parts. The Non-iterative part is an auto-correlation process used to determine a large time mismatch case to maximize the converging speed. The iterative part is used to determine smaller time mismatch case to achieve high resolution results.

The DSP-CPU 225 performs the time alignment process and power amplifier modeling for the digital pre-distortion function. The DSP-CPU 225 receives a feedback captured signal output from the PA 255. The adaptive in-network time alignment process employs the auto-correlation results of the feedback captured signal to determine an initial time mismatch and, based on the ACPR or EVM of the feedback captured signal, performs adaptive updating the time delay (TD) blocks in the envelope path, the sum of the fractional delay and the coarse delay.

The DSP-CPU 225 is configured to use updating parameters to perform the adaptive time alignment process. The updating parameters per iteration include the correction of the time delay ($\Delta TD$) and the updating direction. The DSP-CPU 225 changes the correction of the time delay with the deviation between the current and the targeting mask performances. Correction is big when the deviation is big. Correction is small when the deviation is small. The mask performances include UTRA, EUTRA and EVM. The DSP-CPU 225 determines the updating direction by the nearby (mask performance)$_{+\tau}$ with a minimum time alignment resolution, $+\tau$. If (mask performance)$_{+\tau}$>(mask performance)$_{current}$ $$TD=TD+\Delta TD \quad (1)$$

Otherwise $$TD=TD-\Delta TD \quad (2)$$

The DSP-CPU 225 computes a correction delta time delay ($\Delta TD$) per iteration. The DSP-CPU 225 selects and dynamically changes the correction of the time delay per iteration based on the current ACPR. When the ACPR is deviated from mask requirements, for example greater than 4~5 dBc, the DSP-CPU 225 selects a correction with a bigger time delay to increase the algorithm converging speed. However, when the ACPR is closer to the targeting mask performance, the DSP-CPU 225 reduces the correction to a smaller time delay to reduce the algorithm tracking noise while the ET PA 170 operating smoothly toward the optimal performance. During the ET PA 170 operation, the ET PA 170 invokes the auto-correlation process to determine the time delay when a perturbation causes a large time mismatch, which is quantified by the ACPR changed, for example 4~5 dBc degradation. In certain embodiments, the DSP-CPU 225 invokes the auto-correlation process. In certain embodiments, the main processor 140, or other processing circuitry (such as the RX processing circuitry 125, TX processing circuitry 115 or RF transceiver 110) invoke the auto-correlation process.

Time alignment is required to eliminate the distortion caused by the delay mismatch. Certain cross-correlation/auto-correlation based algorithms that estimate the time mismatch have one or more of the following limitations:

Estimate error: The performance of cross-correlation/auto-correlation algorithms is influenced by the dynamic supply voltage condition and the mask requirements. This requires high computation time to achieve acceptable ET performance.

Algorithm blind spot: These algorithms performances have limited resolution to estimate a small delay mismatch.

Time alignment requires iterative algorithm to achieve high precision time alignment. The correction size selection is critical to the performance of this algorithm. Iterative algorithm with fixed time delay correction has to tradeoff the performance of the converging speed and time alignment stability.

Time Delay(Current state)=Time Delay(Previous state)±Correction    (3)

The In-Network Adaptive Time Alignment Procedure

In-Network delay mismatch problems can occur in an ET system. As noted herein above, ET linearity performance in terms of ACPR and EVM at the output of the PA is highly sensitive to the delay mismatch between envelope path and RF path. Clipping of the amplified signal can result due to a misalignment between the envelope path and the RF path occurs. Conventional digital pre-distortion algorithms cannot compensate for linearity degradation caused by the delay mismatch. In embodiments of the present disclosure, the ET PA 170 incorporates an adaptive time alignment algorithm operating in the stealth mode to compensate the delay mismatch without failing the mask performance.

Figure 3:
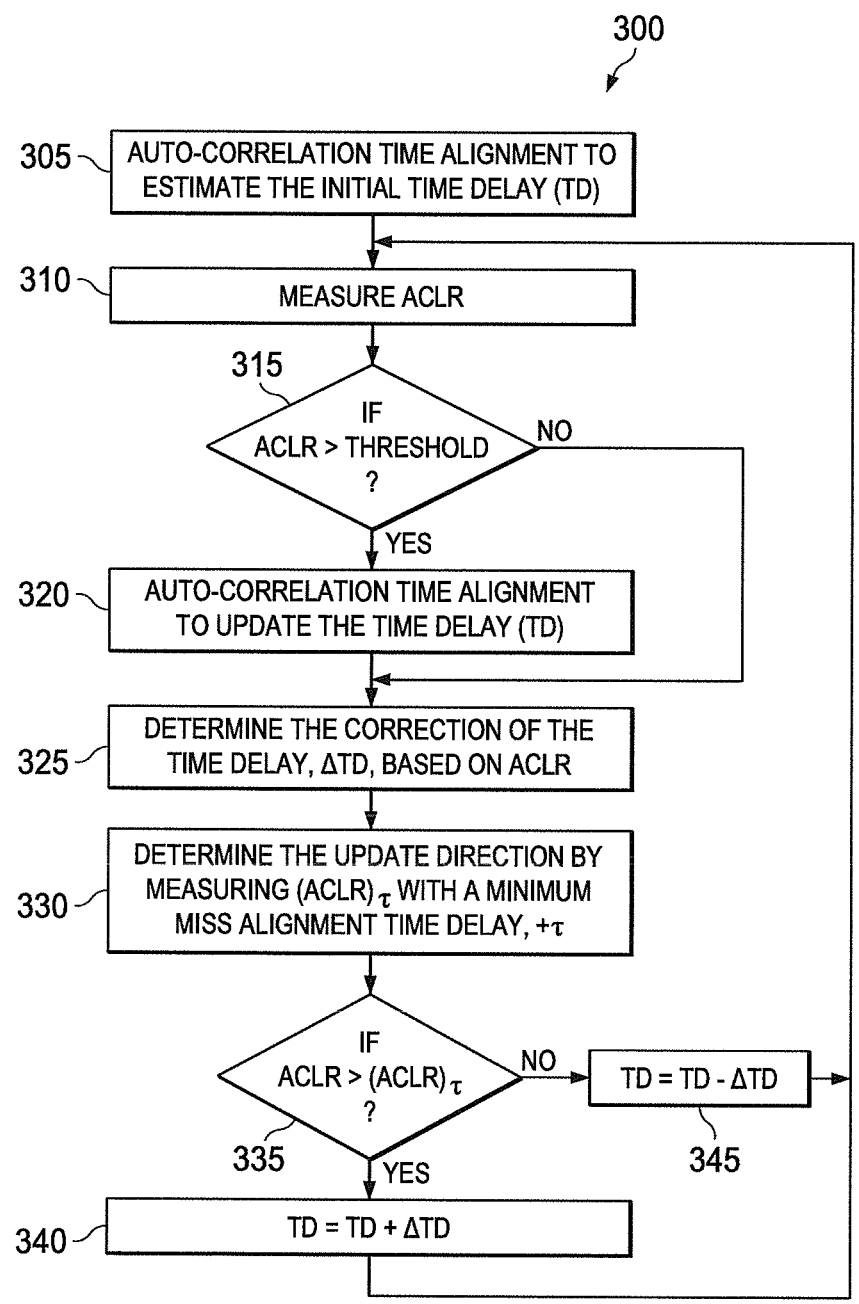
FIGS. 3, 4, 5 and 6 illustrate another adaptive envelope tracking power amplifier alignment process according to embodiments of the present disclosure.

FIG. 3 illustrates an adaptive envelope tracking power amplifier alignment process 300 according to embodiments of the present disclosure. While the flow chart depicts a series of sequential steps, unless explicitly stated, no inference should be drawn from that sequence regarding specific order of performance, performance of steps or portions thereof serially rather than concurrently or in an overlapping manner, or performance of the steps depicted exclusively without the occurrence of intervening or intermediate steps. The process depicted in the example depicted is implemented by a transmitter chain in, for example, a mobile station.

The DSP-CPU 225 is responsible for the time alignment algorithm and RF power amplifier characterization to generate the digital pre-distortion function. Therefore, the DSP-CPU 225 executes the procedures of the in-network time alignment process. The DSP-CPU 225 estimates an initial time delay (TD) of the ET PA 170 in block 305. In block 310, the DSP-CPU 225 measures and checks the ACPR of the ET PA 170 output signal. For example, the DSP-CPU 225 receives a feedback signal output from the PA 255. The DSP-CPU 225 uses the feedback signal to measure and check the ACPR. Then, in block 310, the DSP-CPU 225 determines whether or not to invoke the auto-correlation time alignment algorithm based on the ACPR. If the DSP-CPU 225 determines that the ACPR is greater than a threshold level in block 315, the DSP-CPU 225 determines that a large time mismatch occurred and that the auto-correlation time alignment process is required in block 320. In block 320, the DSP-CPU 225 executes the auto-correlation time alignment process to update the time delay. If the DSP-CPU 225 determines that the ACPR is less than or equal to a threshold level in block 315, the DSP-CPU 225 proceeds to block 325. The DSP-CPU 225 determines the correction ($\Delta TD$) of the time delay based on ACPR in block 325. Thereafter, in block 330, the DSP-CPU 225 determines the time delay update direction based on the ET PA 170 output $(ACPR)_\tau$ measurement. In the example shown in FIG. 3, the DSP-CPU 225 determines the time delay update direction by measuring the ET PA 170 output $(ACPR)_\tau$ with a minimum resolution time delay, $\tau$. In block 335, the DSP-CPU 225 determines whether the ACPR is greater than the $(ACPR)_\tau$ (i.e., ACPR>$(ACPR)_\tau$). Based on whether or not ACPR>$(ACPR)_\tau$, the DSP-CPU 225 updates the time delay with the time delay correction. When the ACPR>$(ACPR)_\tau$, the DSP-CPU 225 increases the current time delay with $\Delta TD$ in block 340. When the ACPR≤$(ACPR)_\tau$, DSP-CPU 225 decreases the current time delay with $\Delta TD$ in block 345.

FIG. 3 illustrates an example in which the $(ACPR)_\tau$ measurement at the miss alignment delay is +$\tau$, to determine the time mismatch update direction. When the $(ACPR)_\tau$ measurement at the miss alignment delay is −$\tau$, the process can be modified as shown in FIG. 4.

Figure 4:
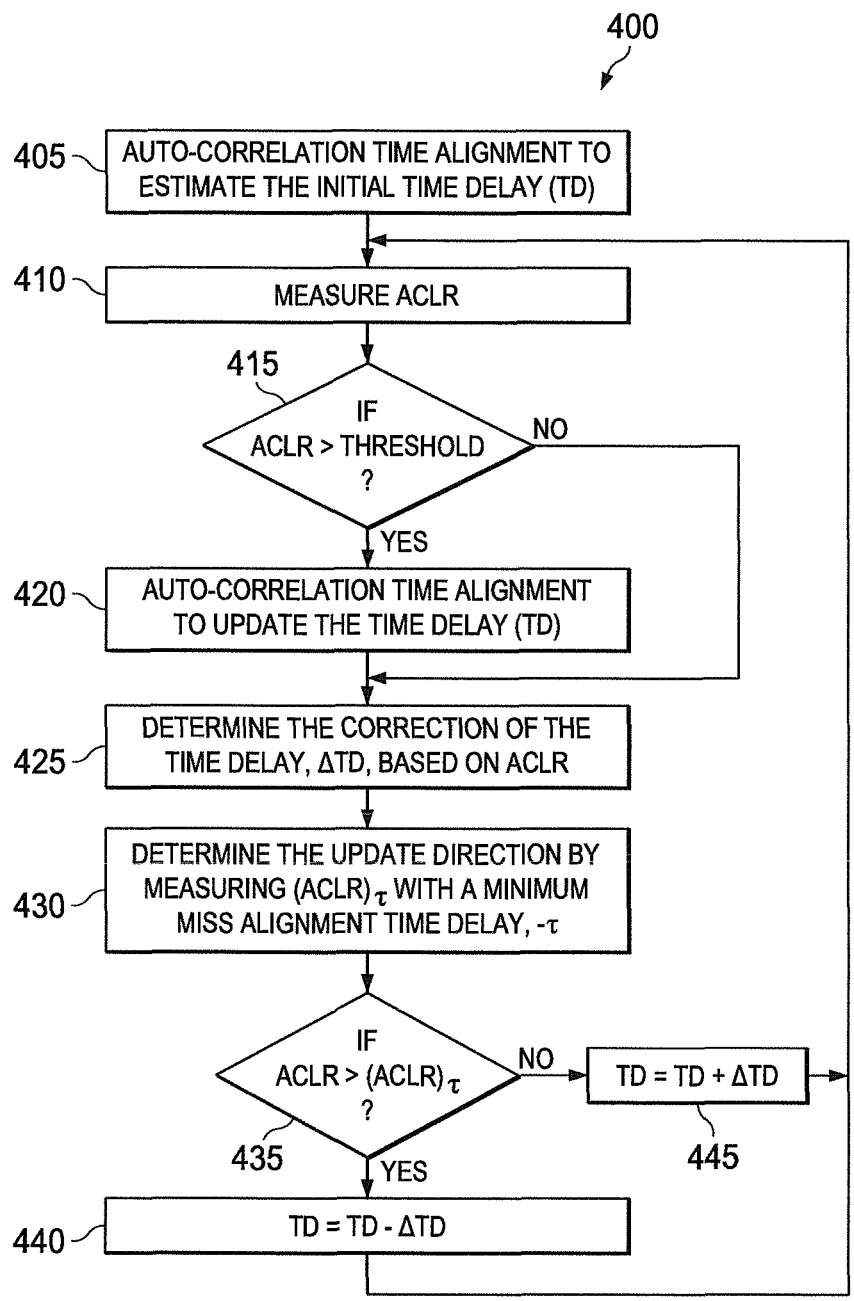

FIG. 4 illustrates another adaptive envelope tracking power amplifier alignment process 400 according to embodiments of the present disclosure. While the flow chart depicts a series of sequential steps, unless explicitly stated, no inference should be drawn from that sequence regarding specific order of performance, performance of steps or portions thereof serially rather than concurrently or in an overlapping manner, or performance of the steps depicted exclusively without the occurrence of intervening or intermediate steps. The process depicted in the example depicted is implemented by a transmitter chain in, for example, a mobile station.

The DSP-CPU 225 is responsible for the time alignment algorithm and RF power amplifier characterization to generate the digital pre-distortion function. Therefore, the DSP-CPU 225 executes the procedures of the in-network time alignment process. The DSP-CPU 225 estimates an initial time delay (TD) of the ET PA 170 in block 405. In block 410, the DSP-CPU 225 measures and checks the ACPR of the ET PA 170 output signal. For example, the DSP-CPU 225 receives a feedback signal output from the PA 255. The DSP-CPU 225 uses the feedback signal to measure and check the ACPR. Then, in block 410, the DSP-CPU 225 determines whether or not to invoke the auto-correlation time alignment algorithm based on the ACPR. If the DSP-CPU 225 determines that the ACPR is greater than a threshold level in block 415, the DSP-CPU 225 determines that a large time mismatch occurred and that the auto-correlation time alignment process is required in block 420. In block 420, the DSP-CPU 225 executes the auto-correlation time alignment process to update the time delay. The DSP-CPU 225 determines the correction ($\Delta TD$) of the time delay based on ACPR in block 425. Thereafter, in block 430, the DSP-CPU 225 determines the time delay update direction based on the ET PA 170 output $(ACPR)_\tau$ measurement. In the example shown in FIG. 4, the DSP-CPU 225 determines the time delay update direction based on the ET PA 170 output $(ACPR)_\tau$ measurement with a minimum resolution time delay, −$\tau$. In block 435, the DSP-CPU 225 determines whether the ACPR is greater than the $(ACPR)_\tau$ (i.e., ACPR>$(ACPR)_\tau$). Based on whether or not ACPR>$(ACPR)_\tau$, the DSP-CPU 225 updates the time delay with the time delay correction. When the ACPR>$(ACPR)_\tau$, the DSP-CPU 225 decreases the current time delay with $\Delta TD$ in block 440. When the ACPR≤$(ACPR)_\tau$, DSP-CPU 225 increases the current time delay with $\Delta TD$ in block 445.

FIGS. 3 and 4 illustrate an example in which (ACPR), measurement is used to determine the time mismatch update direction. When the (EVM), measurement is used, the process can be modified as shown in FIGS. 5 and 6.

Figure 5:
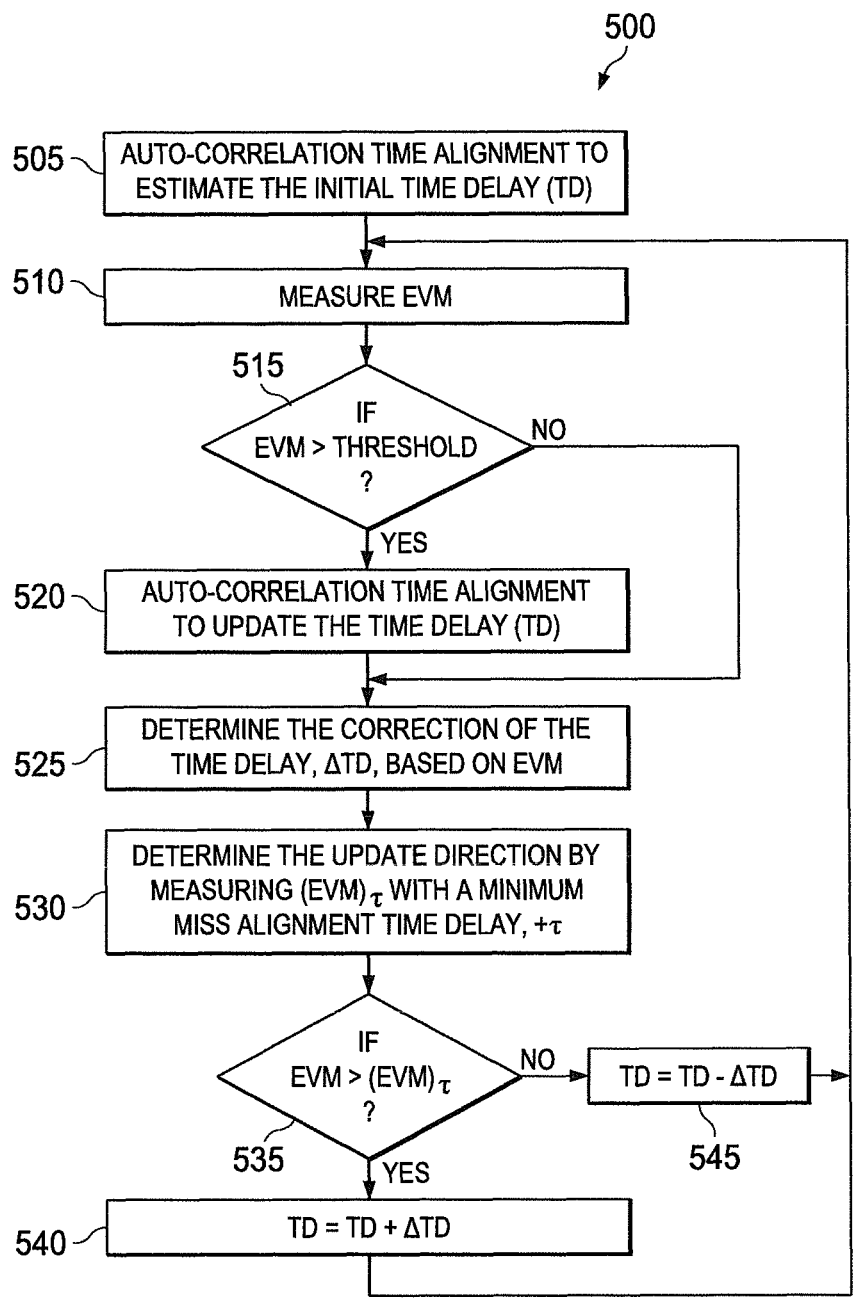
Figure 6:
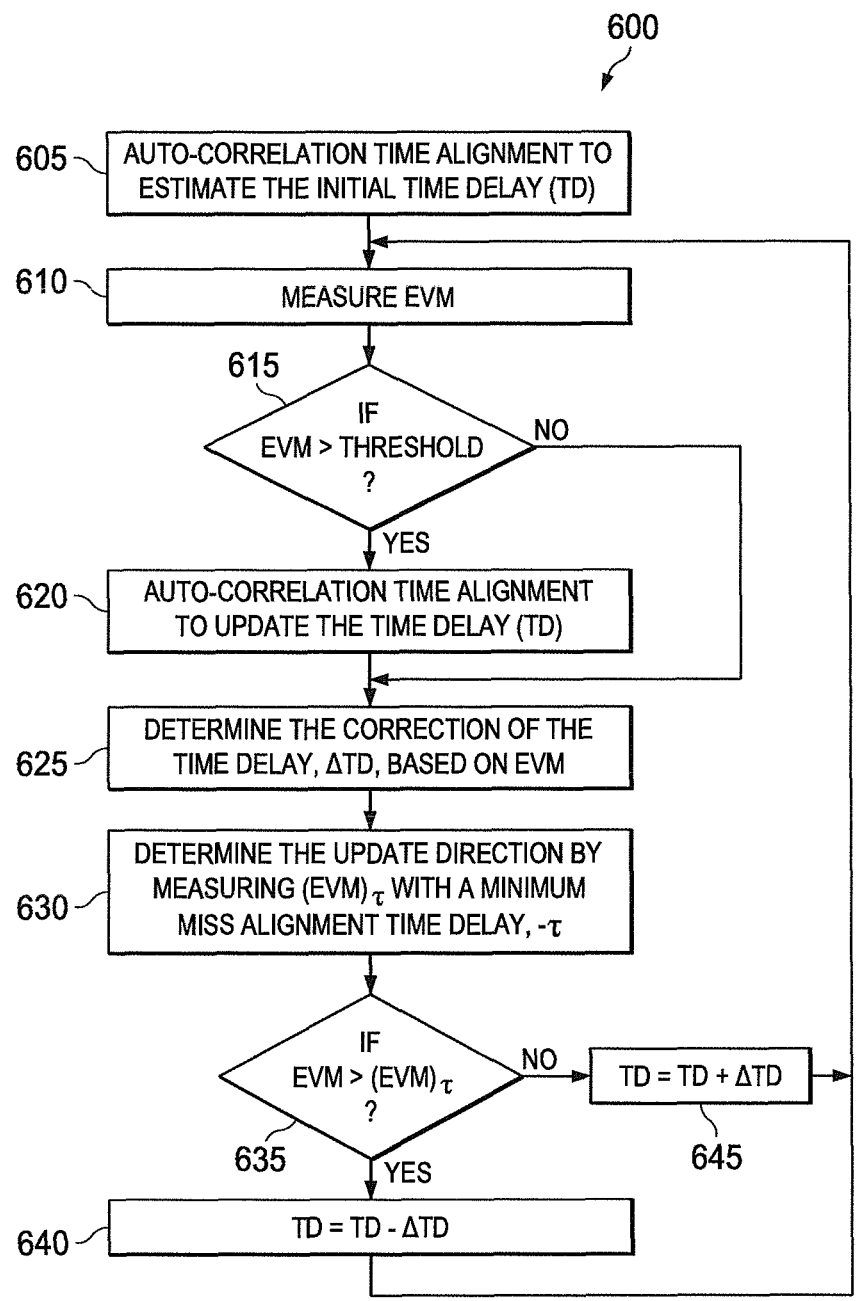

FIG. 5 illustrates another adaptive envelope tracking power amplifier alignment process 500 according to embodiments of the present disclosure. While the flow chart depicts a series of sequential steps, unless explicitly stated, no inference should be drawn from that sequence regarding specific order of performance, performance of steps or portions thereof serially rather than concurrently or in an overlapping manner, or performance of the steps depicted exclusively without the occurrence of intervening or intermediate steps. The process depicted in the example depicted is implemented by a transmitter chain in, for example, a mobile station.

The DSP-CPU 225 is responsible for the time alignment algorithm and RF power amplifier characterization to generate the digital pre-distortion function. Therefore, the DSP-CPU 225 executes the procedures of the in-network time alignment process. The DSP-CPU 225 estimates an initial time delay (TD) of the ET PA 170 in block 505. In block 510, the DSP-CPU 225 measures and checks the EVM of the ET PA 170 output signal. For example, the DSP-CPU 225 receives a feedback signal output from the PA 255. The DSP-CPU 225 uses the feedback signal to measure and check the EVM. Then, in block 510, the DSP-CPU 225 determines whether or not to invoke the auto-correlation time alignment algorithm based on the EVM. If the DSP-CPU 225 determines that the EVM is greater than a threshold level in block 515, the DSP-CPU 225 determines that a large time mismatch occurred and that the auto-correlation time alignment process is required in block 520. In block 520, the DSP-CPU 225 executes the auto-correlation time alignment process to update the time delay. The DSP-CPU 225 determines the correction ($\Delta$TD) of the time delay based on the EVM in block 525. Thereafter, in block 530, the DSP-CPU 225 determines the time delay update direction based on the ET PA 170 output $(EVM)_\tau$ measurement. In the example shown in FIG. 5, the DSP-CPU 225 determines the time delay update direction based on the ET PA 170 output $(EVM)_\tau$ measurement with a minimum resolution time delay, $-\tau$. In block 535, the DSP-CPU 225 determines whether the EVM is greater than the (EVM), (i.e., EVM>$(EVM)_\tau$). Based on whether or not EVM>$(EVM)_\tau$, the DSP-CPU 225 updates the time delay with the time delay correction. When the EVM>$(EVM)_\tau$, the DSP-CPU 225 decreases the current time delay with $\Delta$TD in block 540. When the EVM$\leq(EVM)_\tau$, DSP-CPU 225 increases the current time delay with $\Delta$TD in block 545.

FIG. 5 illustrates an example in which the $(EVM)_\tau$ measurement at the miss alignment delay is $+\tau$, to determine the time mismatch update direction. When the $(EVM)_\tau$ measurement at the miss alignment delay is $-\tau$, the process can be modified as shown in FIG. 6.

FIG. 6 illustrates another adaptive envelope tracking power amplifier alignment process 600 according to embodiments of the present disclosure. While the flow chart depicts a series of sequential steps, unless explicitly stated, no inference should be drawn from that sequence regarding specific order of performance, performance of steps or portions thereof serially rather than concurrently or in an overlapping manner, or performance of the steps depicted exclusively without the occurrence of intervening or intermediate steps. The process depicted in the example depicted is implemented by a transmitter chain in, for example, a mobile station.

The DSP-CPU 225 is responsible for the time alignment algorithm and RF power amplifier characterization to generate the digital pre-distortion function. Therefore, the DSP-CPU 225 executes the procedures of the in-network time alignment process. The DSP-CPU 225 estimates an initial time delay (TD) of the ET PA 170 in block 605. In block 610, the DSP-CPU 225 measures and checks the EVM of the ET PA 170 output signal. For example, the DSP-CPU 225 receives a feedback signal output from the PA 255. The DSP-CPU 225 uses the feedback signal to measure and check the EVM. Then, in block 610, the DSP-CPU 225 determines whether or not to invoke the auto-correlation time alignment algorithm based on the EVM. If the DSP-CPU 225 determines that the EVM is greater than a threshold level in block 615, the DSP-CPU 225 determines that a large time mismatch occurred and that the auto-correlation time alignment process is required in block 620. In block 620, the DSP-CPU 225 executes the auto-correlation time alignment process to update the time delay. The DSP-CPU 225 determines the correction ($\Delta$TD) of the time delay based on the EVM in block 625. Thereafter, in block 630, the DSP-CPU 225 determines the time delay update direction based on the ET PA 170 output $(EVM)_\tau$ measurement. In the example shown in FIG. 6, the DSP-CPU 225 determines the time delay update direction based on the ET PA 170 output $(EVM)_\tau$ measurement with a minimum resolution time delay, $-\tau$. In block 635, the DSP-CPU 225 determines whether the EVM is greater than the $(EVM)_\tau$ (i.e., EVM>$(EVM)_\tau$). Based on whether or not EVM>$(EVM)_\tau$, the DSP-CPU 225 updates the time delay with the time delay correction. When the EVM>$(EVM)_\tau$, the DSP-CPU 225 decreases the current time delay with $\Delta$TD in block 640. When the EVM$\leq(EVM)_\tau$, DSP-CPU 225 increases the current time delay with $\Delta$TD in block 645.

The Auto-Correlation Time Alignment Algorithm

The DSP-CPU 225 invokes the auto-correlation time alignment process can invoke in the ET PA 170 initialization stage to estimate the delay mismatch. DSP-CPU 225 also can invoke the auto-correlation time alignment process when a large time mismatch occurs due to the environments changed during the ET PA 170 operation. The large time mismatch can be identified when ACPR dramatically increases, such as by 4~5 dB.

Determine the Correction of the Time Delay

In certain embodiments, the ET PA 170 is configured to implement time delay updating size dynamically changed per iteration to achieve high tracking capability and low tracking noise performance from the developed adaptive time alignment process. A bigger correction by the DSP-CPU 225 can provide better tracking capability and fast converging speed. Normally a larger correction is required when the ACPR deviates from the targeting mask performance, such as by more than 2 to 3 dB. However, the high tracking capability can cause a tracking noise that even inhibits the ET system from reaching the perfect time alignment. Therefore, a smaller correction of the time delay is required when ACPR is closer to the targeting mask performance, for example less than 2 dB.

Determine the Time Delay Update Direction

The DSP-CPU 225 determines the time delay update direction by comparing the $(ACPR)_\tau$ obtained at current time delay, TD, with additional delay, $+\tau$, to the ACPR measurement at the current time mismatch. When the $(ACPR)_\tau$ is smaller than the current ACPR, DSP-CPU 225 determines that the current time delays need to be increased to optimize the ET PA 170 system linearity, such as by using Equation 4:

$$TD=TD+\Delta TD \quad (4)$$

Similarly, when the $(ACPR)_\tau$ is bigger than the current ACPR, DSP-CPU 225 determines that the current time delays needs to be decreased, such as by using Equation 5:

$$TD=TD-\Delta TD \quad (5)$$

Performance Measurement

FIG. 7 illustrates an example time alignment process converging speed performance with fixed correction according to embodiments of the present disclosure. The embodiment of the example shown in FIG. 7 is for illustration only. The chart 700 shown in FIG. 7 is illustrative of performance of embodiments of certain systems and is not limited to embodiments of the present disclosure.

Time alignment requires iterative algorithm to achieve high precision time alignment. The correction size selection is critical to the performance of existing time alignment algorithms. An iterative algorithm with fixed time delay correction has to tradeoff the performance of the converging speed and time alignment stability. The chart 700 in FIG. 7 illustrates convergence speeds for Auto-correlation with a step size of 1 nano-second (ns) 705; fixed step size of 4 ns 710; fixed step size of 2 ns 715; and fixed step size of 1 ns 720. That is, the smaller the step size, the longer the convergence speed. For example, a step size of 1 ns 720 has a convergence speed of approximately 78 iterations while a step size of 4 ns 710 has a convergence speed of 20 iterations. However, as shown in chart 800 of FIG. 8, the step size of 4 ns experiences severe "ringing" at convergence. For example, the ACLR can range from approximately −38.8 dB to −37.8 dB at convergence for a step size of 4 ns 710 as opposed to a range of less than 0.1 dB (approximately steady at −38.8 dB) for a step size of 1 ns 720.

Figure 9:
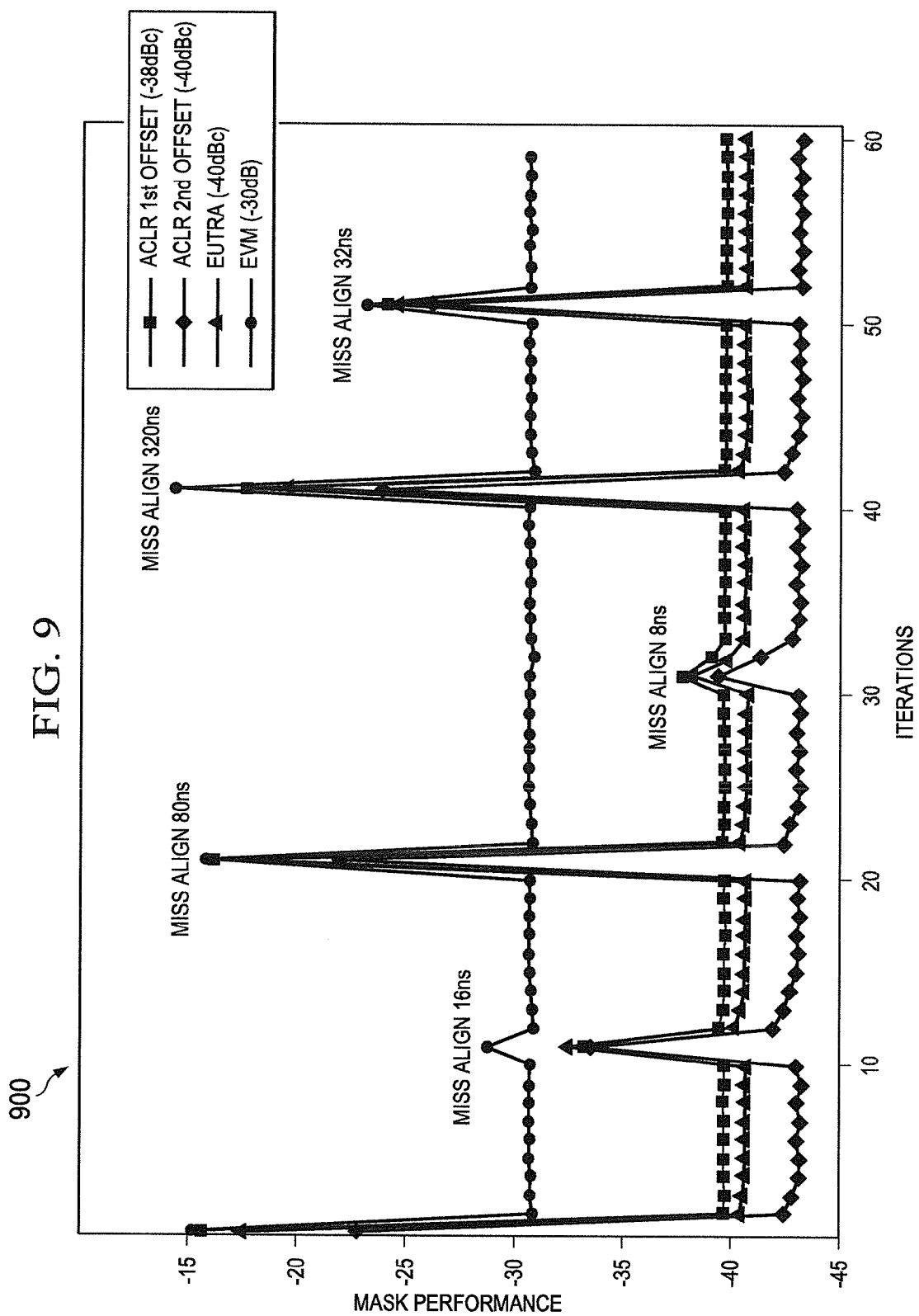
FIG. 9 an example mask performance for an adaptive In-Network time alignment process according to embodiments of the present disclosure.

FIG. 9 an example mask performance for an adaptive In-Network time alignment process according to embodiments of the present disclosure. The embodiment of the example shown in FIG. 9 is for illustration only. The chart 900 shown in FIG. 9 is illustrative of an example of performance of certain embodiments of the present disclosure in certain conditions and systems and should not be construed as limiting.

During the time alignment testing, the perturbations with different time mismatch lengths are deliberating generated. The initial stage and misalignments with 80 ns and 320 ns have a large ACPR $1^{st}$ offset and the auto-correlation process is invoked to estimate the time mismatch and achieve fast time alignment results. When the misalignments with a small amount of time mismatch including 16 ns, 8 ns and 32 ns, the adaptive in-network time alignment process employs a variable correction approach to achieve fast time alignment results. The measurement shows the EVM performance is synchronized with the ACPR $1^{st}$ offset results.

Embodiments of the present disclosure eliminate the correlation based algorithm blind spot and provide high precision time alignment with high speed and stable tracking results. Embodiments of the present disclosure also allow the adaptive time alignment process to estimate the delay mismatch in-network without interrupting communication. Embodiments of the present disclosure optimize the DSP computation time without modifying the legacy terminal ET/CFR/DPD core. Embodiments of the present disclosure can be processed with the narrow bandwidth observation to deliver low cost, high performance closed-loop ET/DPD solution. Embodiments of the present disclosure provide an envelope tracking power amplification system that is configured to extend battery life. Certain embodiments can improve battery performance by 45%-46% efficiency.

It can be also contemplated that various combinations or sub-combinations of the specific features and aspects of the embodiments may be made and still fall within the scope of the appended claims. For example, in some embodiments, the features, configurations, or other details disclosed or incorporated by reference herein with respect to some of the embodiments are combinable with other features, configurations, or details disclosed herein with respect to other embodiments to form new embodiments not explicitly disclosed herein. All of such embodiments having combinations of features and configurations are contemplated as being part of the present disclosure. Additionally, unless otherwise stated, no features or details of any of the embodiments disclosed herein are meant to be required or essential to any of the embodiments disclosed herein, unless explicitly described herein as being required or essential.

Although various features have been shown in the figures and described above, various changes may be made to the figures. For example, the size, shape, arrangement, and layout of components shown in FIGS. 1 and 2 are for illustration only. Each component could have any suitable size, shape, and dimensions, and multiple components could have any suitable arrangement and layout. Also, various components in FIGS. 1 and 2 could be combined, further subdivided, or omitted and additional components could be added according to particular needs. Further, each component in a device or system could be implemented using any suitable structure(s) for performing the described function(s). In addition, while FIGS. 3 through 6 illustrate various series of steps, various steps in FIGS. 3 through 6 could overlap, occur in parallel, occur multiple times, or occur in a different order.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications network, a subscriber station comprising:
a main processor configured to perform a plurality of functions to operate the subscriber station;
a power source configured to provide power to one or more components in the subscriber station; and
an envelope tracking power amplifier (ET PA) configured to amplify a signal, the ETPA configured to estimate and adaptively maintain time alignment between an envelope path and an RF path during operation of the ET PA, wherein the time alignment criterion is based on a mask performances comprising one of Evolved Universal Terrestrial Radio Access (EUTRA), UMTS Terrestrial Radio Access-1 (UTRA1), UMTS Terrestrial Radio Access-2 (UTRA2), and error vector magnitude (EVM) measurement, and wherein the ET PA estimates and adaptively maintains time alignment adaptive using a time-alignment process that includes non-iterative and iterative parts, wherein the Non-iterative part is an auto-correlation process used to determine a large time mismatch case to maximize the converging speed and the iterative part is used to determine smaller time mismatch case to achieve high resolution results.

2. The subscriber station as set forth in claim 1, the ET PA comprising a digital signal processor—central processing unit (DSP-CPU) configured to estimate an initial time delay and measure an adjacent channel power ration (ACPR) and EVM.

3. The subscriber station as set forth in claim 2, wherein the DSP-CPU is configured to determine whether to execute an Auto-Correlation Time Alignment process based on a threshold value of ACLR and EVM.

4. The subscriber station as set forth in claim 2, wherein the DSP-CPU is configured to measure at least one of the EVM and an ET PA output $(ACPR)_\tau$ with a minimum misalignment delay $(\tau)$, and determine, based on the $(EVM)_\tau$ or $(ACPR)_\tau$, a correction stepsize of the time delay $(\Delta TD)$; an update direction.

5. The subscriber station as set forth in claim 4, wherein the misalignment delay, the fraction time of the digital system sampling time, is $+\tau$ or $-\tau$.

6. The subscriber station as set forth in claim 5, wherein the misalignment delay is $+\tau$ and the DSP-CPU is configured to at least one of:
add $\Delta TD$ to the initial time delay if $EVM > (EVM)_\tau$;
subtract $\Delta TD$ from the initial time delay if $EVM \leq (EVM)_\tau$;
add $\Delta TD$ to the initial time delay if $ACPR > (ACPR)_\tau$; and subtract ΔTD from the initial time delay if ACPR≤ (ACPR)$_\tau$.

7. The subscriber station as set forth in claim 5, wherein the misalignment delay is −τ and the DSP-CPU is configured to at least one of:
   add ΔTD to the initial time delay if EVM≤(EVM)$_\tau$;
   subtract ΔTD from the initial time delay if EVM>(EVM)$_\tau$;
   add ΔTD to the initial time delay if ACPR≤(ACPR)$_\tau$; and
   subtract ΔTD from the initial time delay if ACPR> (ACPR)$_\tau$.

8. An Envelope Tracking Power Amplifier (ET PA) comprising:
   an envelope path;
   an RF path;
   a signal processing unit configured to receive a signal;
   a plurality of delays coupled to the signal processing unit and configured to delay a signal transmitted via one of the envelope path and the RF path;
   a power amplifier (ET PA) configured to amplify a signal; and
   a digital signal processor—central processing unit (DSP-CPU) coupled to an output of the power amplifier and to the plurality of delays, the DSP-CPU configured to estimate and adaptively maintain a time alignment between the envelope path and the RF path during operation of the ET PA, wherein the time alignment criterion is based on a mask performances comprising one of Evolved Universal Terrestrial Radio Access (EUTRA), UMTS Terrestrial Radio Access-1 (UTRA1), UMTS Terrestrial Radio Access-2 (UTRA2), and error vector magnitude (EVM) measurement, and wherein the DSP-CPU estimates and adaptively maintains time alignment adaptive using a time-alignment process that includes non-iterative and iterative parts, wherein the non-iterative part is an auto-correlation process used to determine a large time mismatch case to maximize the converging speed and the iterative part is used to determine smaller time mismatch case to achieve high resolution results.

9. The ET PA as set forth in claim 8, the ET PA comprising a digital signal processor—central processing unit (DSP-CPU) configured to estimate an initial time delay and measure an adjacent channel power ration (ACPR) and EVM.

10. The ET PA as set forth in claim 8, wherein the DSP-CPU is configured to determine whether to execute an Auto-Correlation Time Alignment process based on a threshold value of ACLR and EVM.

11. The ET PA as set forth in claim 8, wherein the DSP-CPU is configured to measure at least one of the EVM and an ET PA output (ACPR)$_\tau$ with a minimum misalignment delay (τ), and determine, based on the EVM)$_\tau$ or (ACPR)$_\tau$, a correction stepsize of the time delay (ΔTD); an update direction.

12. The ET PA as set forth in claim 11, wherein the misalignment delay, the fraction time of the digital system sampling time, is + or −τ.

13. The ET PA as set forth in claim 12, wherein the misalignment delay is +τ and the DSP-CPU is configured to at least one of:
   add ΔTD to the initial time delay if EVM>(EVM)$_\tau$;
   subtract ΔTD from the initial time delay if EVM≤(EVM)$_\tau$;
   add ΔTD to the initial time delay if ACPR>(ACPR)$_\tau$; and
   subtract ΔTD from the initial time delay if ACPR≤ (ACPR)$_\tau$.

14. The ET PA as set forth in claim 12, wherein the misalignment delay is −τ and the DSP-CPU is configured to at least one of:
   add ΔTD to the initial time delay if EVM≤(EVM)$_\tau$;
   subtract ΔTD from the initial time delay if EVM>(EVM)$_\tau$;
   add ΔTD to the initial time delay if ACPR≤(ACPR)$_\tau$; and
   subtract ΔTD from the initial time delay if ACPR> (ACPR)$_\tau$.

15. For use in a wireless communications device, a method for envelope tracking power amplification, the method comprising:
   estimating and adaptively maintaining a time alignment between an envelope path and an RF path during the operation of an envelope tracking power amplifier, wherein the time alignment criterion is based on a mask performances comprising one of Evolved Universal Terrestrial Radio Access (EUTRA), UMTS Terrestrial Radio Access-1 (UTRA1), UMTS Terrestrial Radio Access-2 (UTRA2), and error vector magnitude (EVM) measurement, and wherein estimating and adaptively maintaining time alignment adaptive includes non-iterative and iterative parts, wherein the non-iterative part is an auto-correlation process used to determine a large time mismatch case to maximize the converging speed and the iterative part is used to determine smaller time mismatch case to achieve high resolution results.

16. The method as set forth in claim 15, wherein estimating and adaptively maintaining comprises: estimating an initial time delay and measuring an adjacent channel power ration (ACPR) and EVM.

17. The method as set forth in claim 15, wherein estimating and adaptively maintaining comprises: determining whether to execute an Auto-Correlation Time Alignment process based on a threshold value of ACLR and EVM.

18. The method as set forth in claim 15, wherein estimating and adaptively maintaining comprises: measuring at least one of the EVM and an ET PA output (ACPR)$_\tau$ with a minimum misalignment delay (τ), and determining, based on the (EVM)$_\tau$ or (ACPR)$_\tau$, a correction stepsize of the time delay (ΔTD); an update direction.

19. The method as set forth in claim 18, wherein the misalignment delay, the fraction time of the digital system sampling time, is +τ or −τ.

20. The method as set forth in claim 19, wherein when the misalignment delay is +τ, estimating and adaptively maintaining comprises one of:
   adding ΔTD to the initial time delay if ACPR>(ACPR)$_\tau$ or EVM>(EVM)$_\tau$, and
   subtracting ΔTD from the initial time delay if ACPR≤ (ACPR)$_\tau$ or EVM≤(EVM)$_\tau$;
wherein when the misalignment delay is −τ, estimating and adaptively maintaining comprises one of:
   adding ΔTD to the initial time delay if ACPR≤(ACPR)$_\tau$ or EVM≤(EVM)$_\tau$, and
   subtracting ΔTD from the initial time delay if ACPR> (ACPR)$_\tau$ or EVM>(EVM)$_\tau$.

* * * * *